(12) United States Patent
Sato et al.

(10) Patent No.: US 9,318,339 B2
(45) Date of Patent: Apr. 19, 2016

(54) POLISHING SLURRY AND POLISHING METHOD

(71) Applicant: MITSUI MINING & SMELTING CO., LTD., Tokyo (JP)

(72) Inventors: Ryuichi Sato, Saitama (JP); Yohei Maruyama, Saitama (JP); Atsushi Koike, Saitama (JP)

(73) Assignee: MITSUI MINING & SMELTING, LTD, Tokyo (JP)

( * ) Notice: Subject to any disclaimer, the term of this patent is extended or adjusted under 35 U.S.C. 154(b) by 0 days.

(21) Appl. No.: 14/347,637

(22) PCT Filed: Oct. 12, 2012

(86) PCT No.: PCT/JP2012/076446
§ 371 (c)(1),
(2) Date: Mar. 26, 2014

(87) PCT Pub. No.: WO2013/054883
PCT Pub. Date: Apr. 18, 2013

(65) Prior Publication Data
US 2014/0242750 A1    Aug. 28, 2014

(30) Foreign Application Priority Data

Oct. 13, 2011   (JP) .................................. 2011-225625
Jan. 31, 2012   (JP) .................................. 2012-018931

(51) Int. Cl.
*C09G 1/02*        (2006.01)
*H01L 21/306*      (2006.01)
(Continued)

(52) U.S. Cl.
CPC ........ *H01L 21/30625* (2013.01); *B24B 37/044* (2013.01); *C09G 1/02* (2013.01);
(Continued)

(58) Field of Classification Search
USPC .............................. 216/88, 89; 438/692, 693
See application file for complete search history.

(56) References Cited

U.S. PATENT DOCUMENTS 6,270,395 B1   8/2001   Towery et al.
6,610,114 B2   8/2003   Towery et al.
(Continued)

FOREIGN PATENT DOCUMENTS

JP   2000-160138 A   6/2000
JP   2001-205555 A   7/2001
(Continued)

OTHER PUBLICATIONS

Tadashi Hasegawa, et al. "Application of Manganese Slurry to CMP Process of SiC Substrate." The Japan Society of Mechanical Engineers, 2010, No. 108-163, pp. 95-96.
(Continued)

*Primary Examiner* — Shamim Ahmed
(74) *Attorney, Agent, or Firm* — Roberts & Roberts, LLP

(57) ABSTRACT

The present invention provides a polishing slurry capable of polishing even high-hardness materials such as silicon carbide and gallium nitride at a high polishing speed. The present invention is a polishing slurry including a slurry containing a manganese oxide particle and a manganate ion for polishing high-hardness materials having a Mohs hardness of 8 or higher. In the present invention, the manganese oxide particle in the slurry is preferably 1.0 mass % or more; the manganese oxide is preferably manganese dioxide; and the manganate ion is preferably permanganate ion. The polishing slurry according to the present invention enables even high-hardness hardly-machinable materials such as silicon carbide and gallium nitride to be polished smoothly at a high speed.

11 Claims, 1 Drawing Sheet

(51) Int. Cl.
  *H01L 21/02* (2006.01)
  *B24B 37/04* (2012.01)
  *C09K 3/14* (2006.01)
  H01L 29/16 (2006.01)
  H01L 29/20 (2006.01)

(52) U.S. Cl.
  CPC ............ *C09K 3/1409* (2013.01); *C09K 3/1463* (2013.01); *H01L 21/02024* (2013.01); *H01L 21/02527* (2013.01); H01L 29/1608 (2013.01); H01L 29/2003 (2013.01)

(56) References Cited

U.S. PATENT DOCUMENTS

| | | |
|---|---|---|
| 6,835,120 B1 | 12/2004 | Matsui |
| 7,998,866 B2 | 8/2011 | White et al. |
| 2002/0009955 A1 | 1/2002 | Towery et al. |
| 2003/0119316 A1* | 6/2003 | Klein et al. .................. 438/689 |
| 2003/0153255 A1* | 8/2003 | Hasegawa et al. ............ 451/526 |
| 2004/0203324 A1* | 10/2004 | Smith et al. ..................... 451/41 |
| 2006/0236922 A1* | 10/2006 | Ishibashi et al. ................ 117/94 |
| 2007/0200089 A1* | 8/2007 | Inaba et al. .................. 252/79.1 |
| 2008/0153292 A1 | 6/2008 | White et al. |
| 2010/0224963 A1* | 9/2010 | Ishibashi et al. .............. 257/615 |
| 2010/0258528 A1 | 10/2010 | Singh et al. |
| 2012/0240478 A1 | 9/2012 | Horiuchi et al. |
| 2012/0240479 A1 | 9/2012 | Doi et al. |

FOREIGN PATENT DOCUMENTS

| | | |
|---|---|---|
| JP | 2002-526594 A | 8/2002 |
| JP | 2008-68390 A | 3/2008 |
| JP | 2009-238891 A | 10/2009 |
| JP | 2010-182782 A | 8/2010 |
| JP | 2011-513991 A | 4/2011 |
| JP | 2011-121153 A | 6/2011 |
| JP | 2011-122102 A | 6/2011 |
| WO | 2010/120784 A1 | 10/2010 |

OTHER PUBLICATIONS

Tadashi Hasegawa, et al. "Sanka Manganese-kei Slurry o Mochiita SiC Tankessho Kiban no Seimitsu Kako," 2011 Nendo Seimitsu Kogakukai Shunki Taikai Gakujutsu Koenkei Koen Ronbunshu, Sep. 1, 2011, E33.

* cited by examiner

POLISHING SLURRY AND POLISHING METHOD

BACKGROUND OF THE INVENTION

1. Field of the Invention

The present invention relates to a polishing slurry to polish high-hardness materials, particularly to a polishing technology capable of speedily and smoothly polishing high-hardness materials such as silicon carbide and gallium nitride.

2. Description of the Related Art

Among semiconductor devices, in power semiconductor elements, so-called power devices, use of silicon carbide, gallium nitride, diamond or the like as substrates in place of silicon, which has been conventionally used, is proposed for the purpose of higher breakdown voltage and larger current. These substrates composed of silicon carbide or the like, since having a larger band gap than silicon substrates, can resultantly withstand higher voltages. The high-breakdown voltage property of the substrates composed of silicon carbide, gallium nitride or the like is deemed to be originated from the fact that the atomic arrangement of atoms constituting the silicon carbide or the like is denser than silicon.

By contrast, due to a particularly high hardness, substrates composed of silicon carbide, gallium nitride or the like have a problem of being hardly capable of being polished with polishing materials, which have been used conventionally. Silicon carbide and the like, since having a dense atomic arrangement as described above, have particularly a high hardness, and are high-hardness materials whose hardnesses in terms of Mohs hardness are about 9 for silicon carbide and gallium nitride and 10 for diamond. In order to polish these high-hardness materials, materials having a high hardness, such as diamond and aluminum oxide, have been used as an abrasive particle. However, if polishing is carried out by use of diamond or the like, only mechanical polishing progresses, which thereby causes defects and distortions to be easily generated in substrates, thus posing a risk of lacking the reliability of devices. Such a tendency becomes more emphatic, the higher the hardness of substrates.

In order to cope with the above problem, there are proposed polishing materials, as polishing materials for high-hardness materials such as silicon carbide and gallium nitride, in which an oxidative solution of hydrogen peroxide, ozone, permanganic acid or the like is added to an abrasive particle of silicon oxide, aluminum oxide or the like (Patent Literatures 1 to 3). There are proposed an polishing material whose polishing power is enhanced by use of chromium oxide together with a powdery or liquid oxidizing agent (Patent Literature 4), and also an polishing material whose polishing power is enhanced without addition of an oxidative solution by use of an abrasive particle having a specific shape (Patent Literature 5). There are also proposed applicable materials as abrasive particles and oxidizing agents (Patent Literatures 6, 7 and 8). For polishing treatment of high-hardness materials, there is further proposed an polishing material in which manganese dioxide is disposed as an outermost surface layer of an abrasive particle of silicon oxide or silicon carbide by coating or the like (Patent Literature 9).

PRIOR ART DOCUMENTS

Patent Literature

[Patent Literature 1]
  Japanese Patent Laid-Open No. 2009-238891
[Patent Literature 2]
  Japanese Patent Laid-Open No. 2010-182782
[Patent Literature 3]
  National Publication of International Patent Application No. 2011-513991
[Patent Literature 4]
  Japanese Patent Application Laid-Open No. 2001-205555
[Patent Literature 5]
  Japanese Patent Application Laid-Open No. 2011-121153
[Patent Literature 6]
  Japanese Patent Application Laid-Open No. 2000-160138
[Patent Literature 7]
  National Publication of International Patent Application No. 2002-526594
[Patent Literature 8]
  International Publication No. WO 2010/120784
[Patent Literature 9]
  U.S. Patent Application Publication No. 2010/0258528

SUMMARY OF THE INVENTION

Problems to be Solved by the Invention

Although a number of polishing materials have been proposed as described above, high-hardness materials such as silicon carbide and gallium nitride are remarkably hardly machined, and the polishing speed, even if these polishing materials are used, is very low as compared to that for silicon or the like, which is conventionally used as a substrate. As seen in Patent Literature 9, in the case where polishing is carried out by addition of permanganic acid to an abrasive particle in which manganese dioxide is disposed as the outermost surface layer by coating or the like, although use of the abrasive particle having a Mohs hardness of 6 or lower allows efficient polishing of high-hardness materials, over-time deterioration of the polishing capability of the slurry cannot be avoided. Particularly for the case of the use of a slurry in a long time, that is, in the case of circulating and continuous use thereof, it is pointed out that the polishing material is unsuitable. On such a background, the present invention provides a polishing slurry capable of polishing even high-hardness materials at a high polishing speed and smoothly, and the polishing slurry capable of being easily produced and capable of being used in circulating and continuous use.

Means for Solving the Problems

The present invention, which solves the above-mentioned problem relates to a polishing slurry which comprises a slurry comprising a manganese oxide particle and a manganate ion wherein the manganate ion in the slurry is 0.1 mass % or more, and which is for polishing high-hardness materials having a Mohs hardness of 8 or higher. If a solid-state manganese oxide particle and a manganate ion coexist in a slurry as in the polishing slurry according to the present invention, the slurry exhibits high polishing power even in the case of polishing high-hardness materials such as silicon carbide and gallium nitride. Here, the "Mohs hardness" in the present invention refers to a basis for hardness expressed as an index of being susceptible to scratch, with reference to standard substances whose Mohs hardnesses are set in 10 steps of from 1 to 10. High-hardness materials having a Mohs hardness of 8 or higher include silicon carbide, gallium nitride and diamond.

Such exhibition of high polishing power by the polishing slurry according to the present invention is deemed to be because the coexistence, in the slurry, of an oxidative particle of a metal element capable of taking various oxidation numbers and an ion constituted of the same metal element as the metal element constituting the oxidative particle and having higher oxidizing power promotes, by the oxidation number fluctuation of the metal atom, the reversible reaction, between the oxidative particle and the ion in the slurry, modified to a form exhibiting a polishing property more suitable for a microscopic and chemical surface state of a substance to be polished. Then, the present inventors have paid attention to manganese as a metal element to cause the oxidation number fluctuation, and have found that a case where a manganese oxide particle and a manganate ion are concurrently used makes a polishing slurry exhibiting especially high polishing power. This finding has led to the present invention.

In the polishing slurry according to the present invention, as the manganese oxide particles, manganese(II) oxide: $MnO$, dimanganese(III) trioxide: $Mn_2O_3$, manganese(IV) dioxide: $MnO_2$, trimanganese tetraoxide: $Mn_3O_4$ and the like can be applied, and particularly manganese dioxide, which has high oxidizing power, is suitable. As the manganate ions, $MnO_4^-$, $MnO_4^{2-}$, $MnO_4^{3-}$, $MnO_4^{6-}$ and the like can be applied, and particularly permanganate ion ($MnO_4^-$), which has high oxidizing performance, is suitable. The case where a polishing slurry contains both manganese dioxide ($MnO_2$) and permanganate ion ($MnO_4^-$) provides especially high polishing power.

The manganate ion in the polishing slurry according to the present invention is 0.1 mass % or more. Even if the manganate ion is 5.0 mass % or more, no further improvement in polishing power in the early usage period is attained whereas if the manganate ion exceeds 3.0 mass %, the capability of the circulating and continuous use of the slurry is likely to decrease. Therefore, the manganate ion in the polishing slurry according to the present invention is preferably 0.1 mass % to 3.0 mass %. Here, the content of manganate ions in a polishing slurry can be measured with the ion chromatography or the absorption spectrophotometry.

The manganese oxide particle in a polishing slurry is preferably 1.0 mass % or more, and especially preferably 2.0 mass % or more. Such a polishing slurry provides especially high polishing power. The manganese oxide particle is preferably 35 mass % or less, and especially preferably 10 mass % or less, in order to secure suitable flowability in handling of the polishing slurry.

In the present invention, the molar concentration ratio of manganate ions to manganese oxides in a polishing slurry is preferably a proportion of 0.01 or more, and more preferably a proportion of 0.2 or more. The molar concentration of a manganese oxide refers to a value calculated as a molar concentration by conversion of a weight of the each manganese oxide particle being an abrasive particle to an amount of the substance by use of the corresponding molecular weight, and thereafter dividing the amount by a solvent weight. The molar concentration of a manganate ion also is calculated for a manganate ion supply substance, similarly to the above-mentioned molar concentration of a manganese oxide.

The polishing slurry is preferably neutral to alkaline, that is, preferably has a pH of 5.5 or higher, and more preferably 7 or higher. The pH is more preferably 5.5 to 10.5, and most preferably 7 to 10. This is because whereas manganate ions contained in the polishing slurry according to the present invention are generally known to exhibit high oxidizing performance in an acidic solution, manganese oxide particles coexisting with the manganate ions are likely to hardly maintain the dispersion state and easily aggregate in acidity, and the aggregated particles sometimes scratch polishing objects. Further since in a high alkalinity, manganate ions are rapidly reduced to manganese oxides, and are unlikely to be able to exhibit high oxidizing performance.

The polishing slurry according to the present invention is effective for the case of polishing high-hardness materials having a Mohs hardness of 8 or higher. The polishing slurry according to the present invention, even in the case of being used repeatedly, allows for long-time polishing. The polishing slurry according to the present invention has a feature of achieving polishing treatment not with the polishing action by decomposition of an oxidative liquid as in conventional cases but with the continuous action by the equilibrium between manganese ions from manganese oxide particles and manganate ions. Therefore, the polishing slurry can maintain the polishing treatment of a low profile irregularity not only in use thereof of only one time (pouring) as in the conventional cases, but also over a long time even in repeated (circulated) use thereof.

As described hitherto, the polishing slurry according to the present invention is suitable for polishing high-hardness materials having a Mohs hardness of 8 or higher, such as silicon carbide, gallium nitride and diamond, and particularly best for polishing silicon carbide.

Advantageous Effects of the Invention

The polishing slurry according to the present invention enables hardly machinable materials having a high hardness such as silicon carbide and gallium nitride to be polished smoothly at a high speed.

DETAILED DESCRIPTION OF THE PREFERRED EMBODIMENTS

Figure 1:
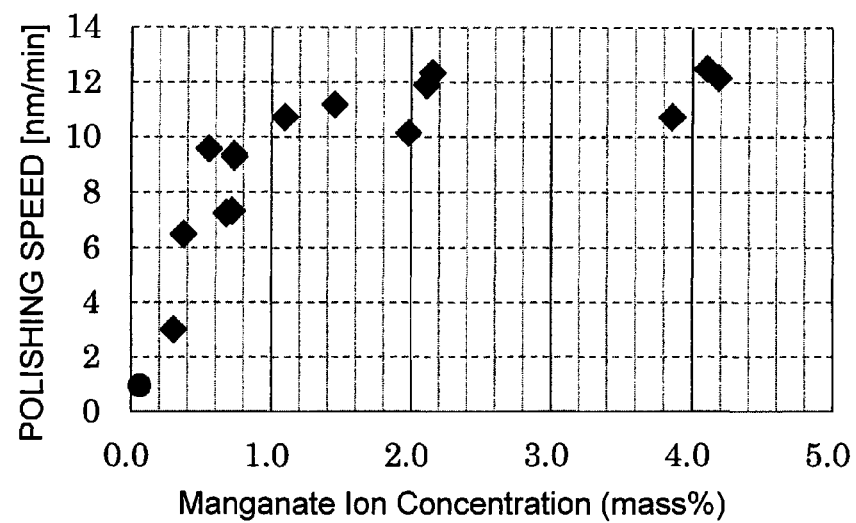
FIG. 1 is a correlation graph between the manganate ion concentration and the polishing rate.

Hereinafter, the preferred embodiments in the present invention will be described.

Example 1

Fabrication of a polishing slurry: 20 g of a microparticulate powder ($D_{50}$: 0.30 μm, specific surface area: 48.7 m$^2$/g, crystallite diameter: 2.0 nm, type: γ-$MnO_2$; and also the below Examples 2 to 10 and Comparative Examples 1 and 2 used the same microparticulate powder as an abrasive particle) of electrolytic $MnO_2$ (made by Mitsui Mining & Smelting Co., Ltd.) and 980 g of pure water were mixed, and 9.8 g of $KMnO_4$ (made by Wako Pure Chemical Industries, Ltd.) was added thereto and the mixture was stirred to fabricate a polishing slurry. Here, the average particle diameter $D_{50}$ refers to a 50% diameter in the cumulative fraction in terms of volume in a laser diffraction/scattering particle diameter distribution. The measurement of the average particle diameter $D_{50}$ was carried out after 3 min of an ultrasonic dispersing treatment for dispersion of the oxide particle, and by use of a laser diffraction/scattering particle diameter distribution analyzer (LA-920 made by HORIBA Ltd.). The crystallite diameter was a numerical value acquired by measurement by the Scherrer method. The specific surface area was a numerical value acquired by measurement by the BET method.

Polishing test: polishing was carried out with the above polishing material slurry according to the following procedure. A polishing object used was a wrapped 4H—SiC substrate of 2 or 3 inches in diameter. Polishing was carried out against a Si surface of the substrate. A polishing apparatus used was a single side polishing machine BC-15 made by MAT Inc. For a polishing pad fixed on a platen, SUBA#600 made by Nitta Haas Inc. was used. The rotation frequency of the platen was set at 60 rpm, and the outer periphery velocity was set at 7,163 cm/min. The carrier rotation frequency was set at 60 rpm, and the outer periphery velocity was set at 961 cm/min. The load in the polishing time was set at 200 gf/cm$^2$. The supply amount of a polishing slurry liquid was set at 200 mL/min. The polishing time was set at 3 hours.

Evaluation of the polishing performance: the evaluation after the polishing was carried out as follows. The surface roughnesses Ra (JIS B0601) before and after the polishing were determined by measurement of the surface of the substrate with an atomic force microscope "Dimension 3100" (made by Digital Instruments Inc.), and analysis of the measurement result with the company's software "Nanoscope 5V." The measurement condition was: the measurement range was 10 μm×10 μm; the measurement points were 512× 512 points; and the scanning rate was 1 Hz. A polishing rate (nm/min) was calculated from a mass difference of the substrate before and after the polishing and the density (3.10 g/cm$^3$) of SiC. The evaluation results are shown in Table 1.

Example 2

The same procedure as in Example 1 was carried out, except for altering the addition amount of KMnO$_4$ to 29.4 g. The evaluation results are shown in Table 1.

Example 3

The same procedure as in Example 1 was carried out, except for altering the addition amount of KMnO$_4$ to 58.8 g. The evaluation results are shown in Table 1.

Example 4

40 g of a microparticulate powder of electrolytic MnO$_2$ and 960 g of pure water were mixed, 9.6 g of KMnO$_4$ was added thereto, and the mixture was stirred to fabricate a polishing slurry. The same polishing evaluation as in Example 1 was carried out with the polishing slurry. The results are shown in Table 1.

Example 5

The same procedure as in Example 4 was carried out, except for altering the addition amount of KMnO$_4$ to 28.8 g. The results are shown in Table 1.

Example 6

The same procedure as in Example 4 was carried out, except for altering the addition amount of KMnO$_4$ to 57.6 g. The results are shown in Table 1.

Example 7

100 g of a microparticulate powder of electrolytic MnO$_2$ and 900 g of pure water were mixed, 9.0 g of KMnO$_4$ was added thereto, and the mixture was stirred to fabricate a polishing slurry. The same polishing evaluation as in Example 1 was carried out with the polishing slurry. The results are shown in Table 1.

Example 8

The same procedure as in Example 7 was carried out, except for altering the addition amount of KMnO$_4$ to 27.0 g. The results are shown in Table 1.

Example 9

The same procedure as in Example 7 was carried out, except for altering the addition amount of KMnO$_4$ to 54.0 g. The results are shown in Table 1.

Example 10

The same procedure as in Example 7 was carried out, except for addition of 180 g of NaMnO$_4$ in place of KMnO$_4$. The results are shown in Table 1.

Example 11

The same procedure as in Example 1 was carried out, except for altering the addition amount of KMnO$_4$ to 4.9 g. The results are shown in Table 1.

Example 12

The same procedure as in Example 1 was carried out, except for altering the addition amount of KMnO$_4$ to 7.35 g. The results are shown in Table 1.

Example 13

The same procedure as in Example 1 was carried out, except for altering the addition amount of KMnO$_4$ to 9.8 g. The results are shown in Table 1.

Example 14

The same procedure as in Example 1 was carried out, except for altering the addition amount of KMnO$_4$ to 14.7 g. The results are shown in Table 1.

Example 15

The same procedure as in Example 1 was carried out, except for altering the addition amount of KMnO$_4$ to 19.6 g. The results are shown in Table 1.

Example 16

200 g of a microparticulate powder of electrolytic MnO$_2$ and 800 g of pure water were mixed, 4.0 g of KMnO$_4$ was added thereto, and the mixture was stirred to fabricate a polishing slurry. The same polishing evaluation as in Example 1 was carried out with the polishing slurry. The results are shown in Table 1.

Example 17

Example 17 used as an abrasive particle a microparticulate powder of λ-MnO$_2$ (D$_{50}$: 0.72 μm, specific surface area: 16.0 m$^2$/g, crystallite diameter: 70 nm) obtained by acid-washing of lithium manganate (LiMn$_2$O$_4$) (made by Mitsui Mining & Smelting Co., Ltd.) in a 0.1N HNO$_3$ solution at 95° C. for 120 min. 20 g of the λ-MnO$_2$ and 980 g of pure water were mixed, 29.4 g of KMnO$_4$ (made by Wako Pure Chemical Industries, Ltd.) was added thereto, and the mixture was stirred to fabricate a polishing slurry. The same polishing evaluation as in Example 1 was carried out with the polishing slurry. The results are shown in Table 1.

Example 18

Example 18 used as an abrasive particle $Mn_2O_3$ ($D_{50}$: 1.77 μm, specific surface area: 4.0 m$^2$/g, crystallite diameter: 9.7 nm) produced by calcination of the same microparticulate powder of electrolytic $MnO_2$ as in Example 1 at 800° C. 20 g of the $Mn_2O_3$ microparticulate powder and 980 g of pure water were mixed, 29.4 g of $KMnO_4$ was added thereto, and the mixture was stirred to fabricate a polishing slurry. The same polishing evaluation as in Example 1 was carried out with the polishing slurry. The results are shown in Table 1.

Example 19

In Example 19, 20 g of a microparticulate powder ($D_{50}$: 1.04 μm, specific surface area: 4.9 m$^2$/g, crystallite diameter: 9.6 nm) of $Mn_3O_4$ (made by Mitsui Mining & Smelting Co., Ltd.) and 980 g of pure water were mixed, 29.4 g of $KMnO_4$ was added thereto, and the mixture was stirred to fabricate a polishing slurry. The same polishing evaluation as in Example 1 was carried out with the polishing slurry. The results are shown in Table 1.

Comparative Example 1

40 g of a microparticulate powder of electrolytic $MnO_2$ and 960 g of pure water were mixed to fabricate a polishing slurry. The same polishing evaluation as in Example 1 was carried out with the polishing slurry. The results are shown in Table 1.

Comparative Example 2

150 g of a microparticulate powder of electrolytic $MnO_2$ and 850 g of pure water were mixed to fabricate a polishing slurry. The same polishing evaluation as in Example 1 was carried out with the polishing slurry. The results are shown in Table 1.

Comparative Example 3

100 g of a microparticulate powder of a colloidal silica and 900 g of pure water were mixed to fabricate a polishing slurry. The same polishing evaluation as in Example 1 was carried out with the polishing slurry. The results are shown in Table 1.

Comparative Example 4

100 g of a microparticulate powder of a colloidal silica and 900 g of pure water were mixed, 9.0 g of $KMnO_4$ was added thereto, and the mixture was stirred to fabricate a polishing slurry. The same polishing evaluation as in Example 1 was carried out with the polishing slurry. The results are shown in Table 1.

Comparative Example 5

The same procedure as in Example 16 was carried out, except for altering the addition amount of $KMnO_4$ to 0.8 g. The results are shown in Table 1.

TABLE 1

| | | Slurry | | | | | | Evaluation of Polishing | |
|---|---|---|---|---|---|---|---|---|---|
| | Kind of Abrasive Particle | Concentration of Abrasive Particle (mass %) | B (mol/l) | Concentration of Manganate Ion (mass %) | A (mol/l) | A/B | pH | Polishing Rate [nm/min] | Surface Roughness after Polishing Ra[nm] |
| Example 1 | MnO2 | 1.98 | 0.23 | 0.73 | 0.06 | 0.270 | 8.1 | 9.28 | 0.133 |
| Example 2 | | 1.94 | 0.23 | 2.15 | 0.19 | 0.809 | 8.0 | 12.35 | 0.122 |
| Example 3 | | 1.89 | 0.23 | 4.18 | 0.38 | 1.617 | 9.0 | 12.17 | 0.104 |
| Example 4 | | 3.96 | 0.48 | 0.72 | 0.06 | 0.132 | 7.8 | 7.34 | 0.121 |
| Example 5 | | 3.89 | 0.48 | 2.11 | 0.19 | 0.396 | 8.6 | 11.90 | 0.136 |
| Example 6 | | 3.78 | 0.48 | 4.10 | 0.38 | 0.792 | 8.6 | 12.50 | 0.132 |
| Example 7 | | 9.91 | 1.28 | 0.67 | 0.06 | 0.050 | 8.0 | 7.25 | 0.120 |
| Example 8 | | 9.74 | 1.28 | 1.98 | 0.19 | 0.149 | 8.8 | 10.15 | 0.124 |
| Example 9 | | 9.49 | 1.28 | 3.86 | 0.38 | 0.297 | 9.1 | 10.73 | 0.122 |
| Example 10 | | 8.47 | 1.28 | 12.78 | 1.41 | 1.100 | 8.2 | 13.80 | 0.122 |
| Example 11 | | 1.99 | 0.23 | 0.37 | 0.03 | 0.135 | 7.7 | 6.50 | 0.085 |
| Example 12 | | 1.99 | 0.23 | 0.55 | 0.05 | 0.202 | 7.8 | 9.57 | 0.068 |
| Example 13 | | 1.98 | 0.23 | 0.73 | 0.06 | 0.270 | 7.6 | 9.37 | 0.077 |
| Example 14 | | 1.97 | 0.23 | 1.09 | 0.09 | 0.404 | 7.6 | 10.73 | 0.079 |
| Example 15 | | 1.96 | 0.23 | 1.45 | 0.13 | 0.539 | 7.9 | 11.19 | 0.075 |
| Example 16 | | 19.92 | 2.88 | 0.30 | 0.03 | 0.011 | 7.1 | 3.01 | 0.084 |
| Example 17 | λ-MnO2 | 1.94 | 0.23 | 2.15 | 0.19 | 0.810 | 7.9 | 8.30 | 0.126 |
| Example 18 | Mn2O3 | 1.94 | 0.13 | 2.15 | 0.19 | 0.730 | 5.7 | 8.08 | 0.194 |
| Example 19 | Mn3O4 | 1.94 | 0.09 | 2.15 | 0.19 | 0.710 | 9.6 | 8.15 | 0.196 |
| Comparative Example 1 | MnO2 | 4.00 | 0.48 | 0.00 | 0.00 | 0.000 | 7.5 | 0.77 | 0.113 |
| Comparative Example 2 | | 15.00 | 2.03 | 0.00 | 0.00 | 0.000 | 7.3 | 1.02 | 0.145 |
| Comparative Example 3 | SiO2 | 10.00 | — | 0.00 | 0.00 | — | 7.0 | 0.30 | 0.945 |
| Comparative Example 4 | | 9.91 | — | 0.67 | 0.06 | — | 9.2 | 0.80 | 0.120 |
| Comparative Example 5 | MnO2 | 19.98 | 2.88 | 0.06 | 0.07 | 0.002 | 6.6 | 0.96 | — |

A: a molar concentration of a manganate ion in a slurry (mol/L)
B: a molar concentration of an abrasive particle in a slurry (mol/L)

In Table 1, the A value is a manganate ion concentration determined by the calculation method described in the above paragraph 0012; and the B value is a manganese oxide particle molar concentration. It has been found from the results of Table 1 that the cases where a 4H—SiC substrate was polished by use of polishing material slurries of Examples containing a manganese oxide particle and a manganate ion exhibited much higher polishing rates and lower profile irregularities than the cases of a colloidal silica abrasive particle in Comparative Examples 3 and 4.

Figure 2:
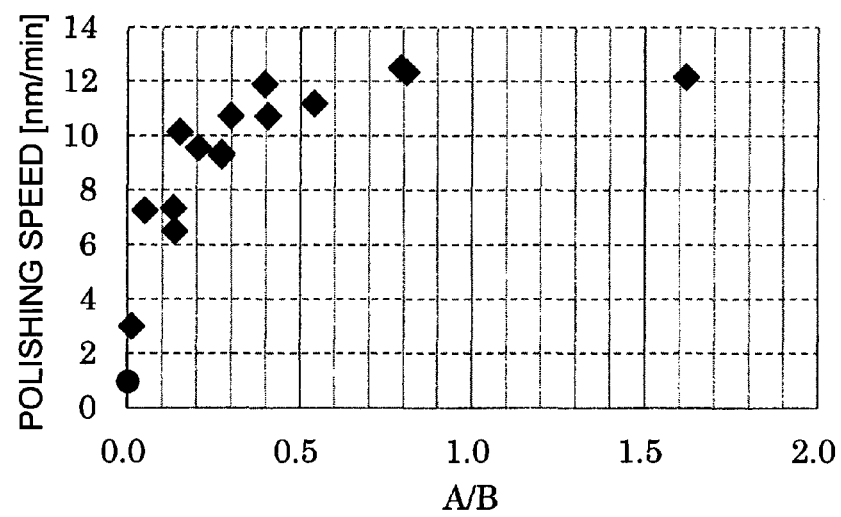
FIG. 2 is a correlation graph between the A/B value and the polishing rate.

With respect to the results (Examples 1 to 16 and Comparative Example 5) shown in Table 1 in which the abrasive particle was $MnO_2$, the relations between the manganate ion concentration or the A/B value and the polishing rate were examined. FIG. 1 shows a graph of the correlation thus examined of the manganate ion concentration and the polishing rate; and FIG. 2 shows a graph of the correlation thus examined of the A/B value and the polishing rate. In FIG. 1 and FIG. 2, the ● mark is the result of Comparative Example 5, and the ♦ marks are the results of Examples 1 to 16.

It is clear from the graph of FIG. 1 that in order to make the polishing rate to be 2 nm/min or more, the manganate ion concentration needed to be 0.1 mass % or more; and in order to make the polishing rate to be 6 nm/min or more, the manganate ion concentration needed to be 0.3 mass % or more. It is also clear from the graph of FIG. 2 that an A/B value of 0.01 or higher gave a high polishing rate of 2 nm/min or higher, and in order to make the polishing rate to be 8 nm/min or higher, the A/B value needed to be 0.2 or higher. An A/B value exceeding 4.0 gave no further improvement in the polishing rate. Also in the case of Examples 17, 18 and 19, which had different abrasive particles, the behavior of the polishing rates depending on the manganate ion concentration and the A/B value was similar.

Then, results in which polishing material slurries were subjected to circulated use and polishing treatment will be described. Evaluated polishing material slurries were those of Example 1, Example 3, Example 12 and Comparative Example 4.

The evaluation method involved using 5 or 10 sheets of wrapped 4H—SiC substrates of 2 inches in diameter and continuously polishing a Si surface of the each substrate in 2 hours with 1 kg of each polishing material slurry (the polishing was for 10 or 20 hours in total). The polishing condition was the same as in the above-mentioned polishing evaluation in Example 1. The polishing slurry was subjected to the circulated use at 200 mL/min. The results are shown in Table 2.

TABLE 2

|  | Example 1 | Example 3 | Example 12 | Comparative Example 4 |
|---|---|---|---|---|
| Concentration of Abrasive Particle (mass %) | 1.98 | 1.89 | 1.99 | 9.91 |
| Concentration of Manganate Ion (mass %) | 0.73 | 4.18 | 0.55 | 0.67 |
| A/B | 0.270 | 1.617 | 0.202 | — |
| Polishing Time | Polishing Rate [nm/min] | | | |
| 2 | 9.43 | 11.81 | 9.57 | 0.80 |
| 4 | 12.03 | 11.41 | 10.96 | 0.86 |
| 6 | 12.49 | 7.78 | 11.29 | 0.29 |
| 8 | 12.49 | 5.68 | 11.46 | 0.23 |
| 10 | 12.09 | 5.34 | 11.46 | 0.10 |

TABLE 2-continued

|  | Example 1 | Example 3 | Example 12 | Comparative Example 4 |
|---|---|---|---|---|
| 12 |  |  | 11.24 |  |
| 14 |  |  | 10.95 |  |
| 16 |  |  | 13.00 |  |
| 18 |  |  | 10.33 |  |
| 20 |  |  | 9.60 |  |

It is clear as shown in Table 2 that from the results of the polishing treatment for 10 hours of Example 1 and Comparative Example 4, the polishing slurry of Example 1 exhibited a very small decrease in the polishing rate even if circulatedly and repeatedly used. By contrast, in the polishing slurry of Comparative Example 4, the polishing rate largely decreased during the repeated polishing treatment for 10 hours if the polishing slurry was circulatedly and repeatedly used, and also no stable profile irregularity could be provided.

From the results of Example 3 and Example 12, a tendency was seen in which if the manganate ion concentration was high, the polishing rate decreased with lapse of time. It has been found from this that it is especially preferable in a long time use that the manganate ion concentration is 4.0 mass % or less. It has been also found that it is especially preferable that the A/B value is 1.5 or lower.

INDUSTRIAL APPLICABILITY

The present invention, since enabling hardly machinable materials having a high hardness such as silicon carbide and gallium nitride to be polished smoothly at a high speed, and allowing for continuous polishing treatment, can achieve the efficient polishing treatment of the high-hardness hardly-machinable materials.

What is claimed is:

1. A polishing slurry comprising a slurry comprising a manganese oxide particle comprised of manganese dioxide and a manganate ion, wherein the manganate ion in the slurry is present in an amount of 0.1 mass % or more and 4.0 mass % or less, and wherein a molar concentration ratio of the manganate ion to the manganese oxide is 0.2 or higher and 1.5 or lower, and wherein the slurry has a pH of 7 to 10.

2. The polishing slurry according to claim 1, wherein the manganese oxide particle in the slurry is present in an amount of 1.0 mass % or more.

3. The polishing slurry according to claim 1 wherein the manganate ion is permanganate ion.

4. The polishing slurry according to claim 1 which comprises a solvent.

5. The polishing slurry according to claim 2, wherein the manganate ion is permanganate ion.

6. The polishing slurry according to claim 4, wherein the manganate ion is permanganate ion.

7. A method for polishing comprising contacting a surface of a high-hardness material having a Mohs hardness of 8 or higher with the polishing slurry defined in claim 1.

8. The method according to claim 7 wherein the high-hardness material is silicon carbide.

9. The method for polishing according to claim 7, comprising repeatedly contacting the surface of the high-hardness material with the polishing slurry.

10. The method of claim 7 where in the high-hardness material comprises one or more of silicon carbide, gallium nitride and diamond.

11. The method for polishing according to claim 7, comprising subsequently contacting a surface of a plurality of high-hardness materials having a Mohs hardness of 8 or higher with the same polishing slurry.

* * * * *